United States Patent [19]

Bickford et al.

[11] Patent Number: 4,956,605
[45] Date of Patent: Sep. 11, 1990

[54] TAB MOUNTED CHIP BURN-IN APPARATUS

[75] Inventors: Harry R. Bickford, Ossining, N.Y.;
William L. Boland, Austin, Tex.;
Daniel P. Morris, Purchase, N.Y.;
Timothy C. Reiley, Los Gatos, Calif.

[73] Assignee: International Business Machines Corporation, Armonk, N.Y.

[21] Appl. No.: 381,623

[22] Filed: Jul. 18, 1989

[51] Int. Cl.$^5$ .................. G01R 31/02; H01L 23/06
[52] U.S. Cl. .............................. 324/158 F; 174/52.4
[58] Field of Search ............ 324/158 F, 158 R, 73 PC, 324/73.1; 174/52.4; 437/8

[56] References Cited

U.S. PATENT DOCUMENTS

| | | | |
|---|---|---|---|
| 3,560,849 | 2/1971 | Ryan et al. | 324/73 |
| 3,761,808 | 9/1973 | Ryan | 324/73 |
| 4,587,548 | 5/1986 | Grabbe et al. | 357/70 |
| 4,716,124 | 12/1987 | Yerman et al. | 437/8 |
| 4,745,354 | 5/1988 | Fraser | 324/73 |
| 4,763,409 | 8/1988 | Takekaiwa et al. | 29/827 |
| 4,779,047 | 10/1988 | Solstad et al. | 324/158 F |
| 4,855,672 | 8/1989 | Shreeve | 324/158 F |

FOREIGN PATENT DOCUMENTS 60-117635 (A) 6/1985 Japan .

Primary Examiner—Ernest F. Karlsen
Attorney, Agent, or Firm—Perman & Green

[57] ABSTRACT

A TAB package comprises an elongated tape which has a plurality of sets of beam leads emplaced thereon and a plurality of electronic devices connected to the beam leads. At least a first beam lead of each set is connected to a common potential terminal on each device, and at least a second beam lead of each set is connected to a power terminal. A common potential bus is oriented along the elongated dimension of the tape and connects to the first beam leads, while a power bus is also oriented along the elongated dimension of the tape and is connected to the second beam leads. The application of power to the power bus and the simultaneous grounding of the common potential bus enables all electronic devices on the tape to be simultaneously energized and to be then subjected to an elevated temperature environment for static burn-in testing. To improve current conduction in the power and common potential buses, a tape comprising a non-conductive carrier and a pair of interposer/conductor tapes may be emplaced over the length of the tape bearing the chips. An additional spacer tape is then emplaced over the interposer tape and forces the interposer conductors into contact with the power and common potential buses.

9 Claims, 3 Drawing Sheets

TAB MOUNTED CHIP BURN-IN APPARATUS

FIELD OF THE INVENTION

This invention relates to burn-in testing of TAB packaged semiconductor devices (i.e. "chips") and more particularly to burn-in testing of TAB packaged chips while they are still mounted on the tape strip.

BACKGROUND OF THE INVENTION

Burn-in is a well-known technique to promote improved reliability of semiconductor chips. It is essentially a procedure to eliminate latent manufacturing flaws in an element or assembly, which, if left undetected, would result in early field failures. Burn-in is accomplished by the application, on an accelerated basis, of environmental and operational stresses to the device or assembly under test. The stress factors include both temperature and design limit voltages.

Burn-in is performed at many levels of the component hierarchy of systems which contain semiconductors, e.g., computers. For instance, it is performed on the unpackaged chip, the second level assembly, packaged components, and higher levels through the final system level burn-in. It is often most cost-effective to conduct burn-in at the lowest packaging level. There, the stresses can be optimized to the specific level of the package, such that higher levels of packaging are not exposed to more stressful conditions than they would otherwise be designed to accomodate. This level of testing also prevents flawed devices from being carried through subsequent manufacturing steps, thereby causing increased costs which result from possible re-work or, potentially, the discarding of higher level assemblies.

Classically, burn-in of first level packages has been accomplished by mounting the chips in individual sockets of a burn-in circuit board. The entire circuit board is then subjected to the stress environment. This technique requires considerable handling of chip packages and is quite expensive. Recently, a new packaging method known as "Tape-Automated Bonding" or TAB packaging has come into vogue. In this method, chips are bonded to a carrier tape, and the tape (with mounted chips) is stored on a reel for use in subsequent automated operations.

The TAB carrier tape is similar to a 35 mm film and is a multi-layer structure with an insulating film base and a conductive layer, typically gold-plated copper. Circuit patterns are formed on the tape to define both chip mounting locations and leads which will make contact with the chip and then fan out. At each location, an integrated circuit chip is positioned adjacent to mounting location pads so that the chip contact pads are aligned with the leads, and then all pads are thermally bonded to the leads.

While the TAB process provides a convenient way of handling chips in automated assembly operations, TAB burn-in procedures have not seen similar advances as the packaging concept. For instance, in U.S. Pat. No. 4,779,047 to Solstad, et al, a plurality of integrated circuits mounted on a short strip of carrier tape are inserted into a fixture which than makes contact between the circuit's leads and a contact array in the fixture. The fixture and IC strip are than subjected to the burn-in operation. In U.S. Pat. No. 4,716,124 to Yerman et al a TAB tape, including mounted chips, is incremented past a test site where control leads fashioned from portions of the tape carrier are contacted by electrical contacts to enable the testing of each individual chip. In U.S. Pat. No. 4,763,409 to Takekawa, et al, a TAB packaged chip is emplaced in a single-chip test fixture where contacts are made and power applied.

As is clear from the aforementioned references, all continue to perform burn-in tests of TAB-mounted semiconductor devices, either on a one-by-one basis or in small groups.

Another aspect of burn-in testing which has seen some application, is the use of temperature controlled heat exchange baths for application of elevated temperatures to the devices under test. Such systems are shown in U.S. Pat. Nos. 3,560,849 to Ryan, et al; 3,761,808 to Ryan; and 4,745,354 to Fraser. Each of those patents immerses individual semi-conductor devices or groups thereof into a heat exchange bath for the purpose of applying an elevated test temperature. None of the aforementioned references indicate that such a procedure is applicable to TAB packages.

Accordingly, it is an object of this invention to provide a burn-in test apparatus which enables a large number of TAB packaged chips to be simultaneously subjected to burn-in.

It is still another object of this invention to provide a system for subjecting a complete roll of TAB packaged chips to a simultaneous burn-in procedure, while also minimizing the number of interconnections to the TAB roll.

It is further object of this invention to employ a fluid immersion heat stress system with TAB package burn-in apparatus.

SUMMARY OF THE INVENTION

A TAB package comprises an elongated tape which has a plurality of sets of beam leads emplaced thereon and a plurality of electronic devices connected to the beam leads. At least a first beam lead of each set is connected to a common potential terminal on each device, and at least a second beam lead of each set is connected to a power terminal on each device. A common potential bus is oriented along the elongated dimension of the tape and connects to the first beam leads, while a power bus is also oriented along the elongated dimension of the tape and is connected to the second beam leads. The application of power to the power bus and the simultaneous grounding of the common potential bus enables all electronic devices on the tape to be simultaneously energized and to be then subjected to an elevated temperature environment for static burn-in testing.

To improve current conduction in the power and common potential buses, a tape comprising a non-conductive carrier and a pair of interposer/conductor tapes may be emplaced over the length of the tape bearing the chips. An additional spacer tape is then emplaced over the interposer tape and forces the interposer conductors into contact with the power and common potential buses to improve the conduction capabilities thereof.

BRIEF DESCRIPTION OF THE DRAWINGS

FIG. 4 is a schematic view of a TAB tape which has been wound on a mandrel and is to be dipped in a heated bath during burn-in.

DETAILED DESCRIPTION OF THE INVENTION

Figure 1:
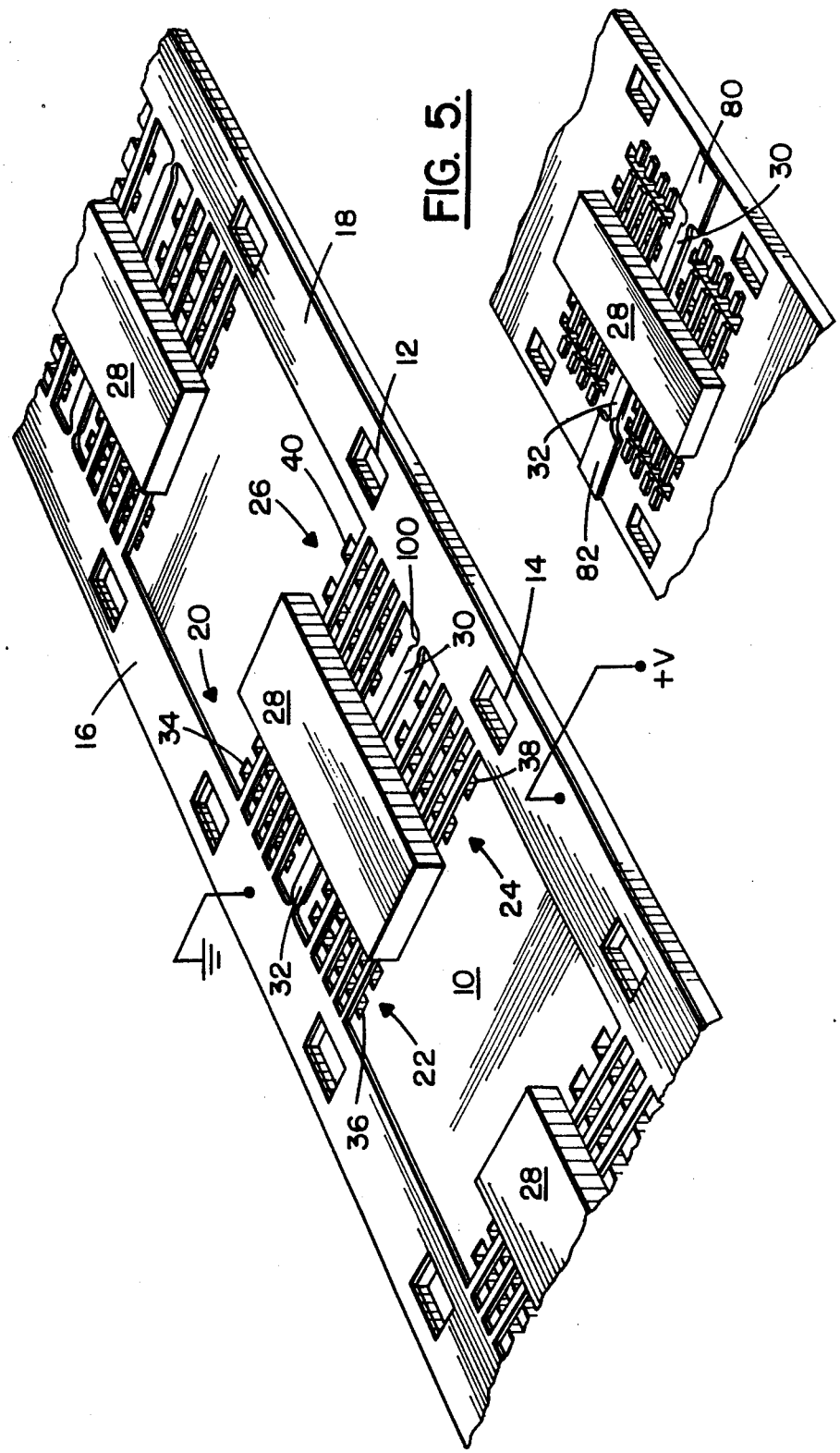
FIG. 1 is a perspective view of a tab mounted chip on a tape, the assembly being constructed in accordance with the invention

Referring now to FIG. 1, tape 10 is an elongated polymer strip which is provided with sprocket holes 12, 14 etc. As is well known, during the manufacture of the tape, a conductive layer of copper is emplaced thereon by lamination, plating or other means and patterned to provide contact areas which mate with conductive land areas of chips to be emplaced thereon. Ordinarily, the conductor pattern is also provided with a very thin gold covering for purposes of corrosion protection and improved bondability. In the tape structure shown in FIG. 1, a pair of conductor buses 16 and 18 run the entire length of tape 10 and are employed respectively, as the ground and power buses. At each chip location, a plurality of signal lines 26 are provided for interconnection with an associated chip (e.g., 28). In addition, a power lead 30 connects power bus 18 to chip 28 and a ground lead 32 connects ground bus 16 to chip 28.

Beneath each group of signal conductors in tape 10, there are two apertures which enable the signal conductors to be selectively cut during the processing of the TAB package. Prior to emplacement of chips on tape 10, all of the conductors are electroplated with a thin layer of gold. During this electroplating process, all of the conductors on tape 10 must be connected to a source of potential to assure proper electroplating. Subsequently (either before or after chip placement), the signal conductors are severed from buses 16 and 18 by insertion of a tool through outer apertures 34, 36, 8 and 40. Thus, once chip 28 is put in place on the signal conductors, it is only connected to ground bus 16 and power bus 18 via conductors 32 and 30 respectively. All of the remaining signal conductors have been severed (e.g. See FIG. 2). Of course, other ground and power connections may be made to a chip via the signal conductors.

At this stage, the circuit is ready for static burn in (i.e. no signals are applied to the signal conductors). A source of voltage is applied to power bus 18 and ground bus 16 is connected to a source of common potential. If tape 10 is not too long, the impedance drop through the buses is sufficiently small that burn-in can occur without any further circuit modification.

During burn-in tape 10 and its attached chips are placed in an environmental stress situation (e.g., elevated temperature) and the buses are maintained in their powered state for a required period of time. In this manner, an entire tape length of chips can be subjected to burn-in while still connected to the TAB tape.

Figure 2:
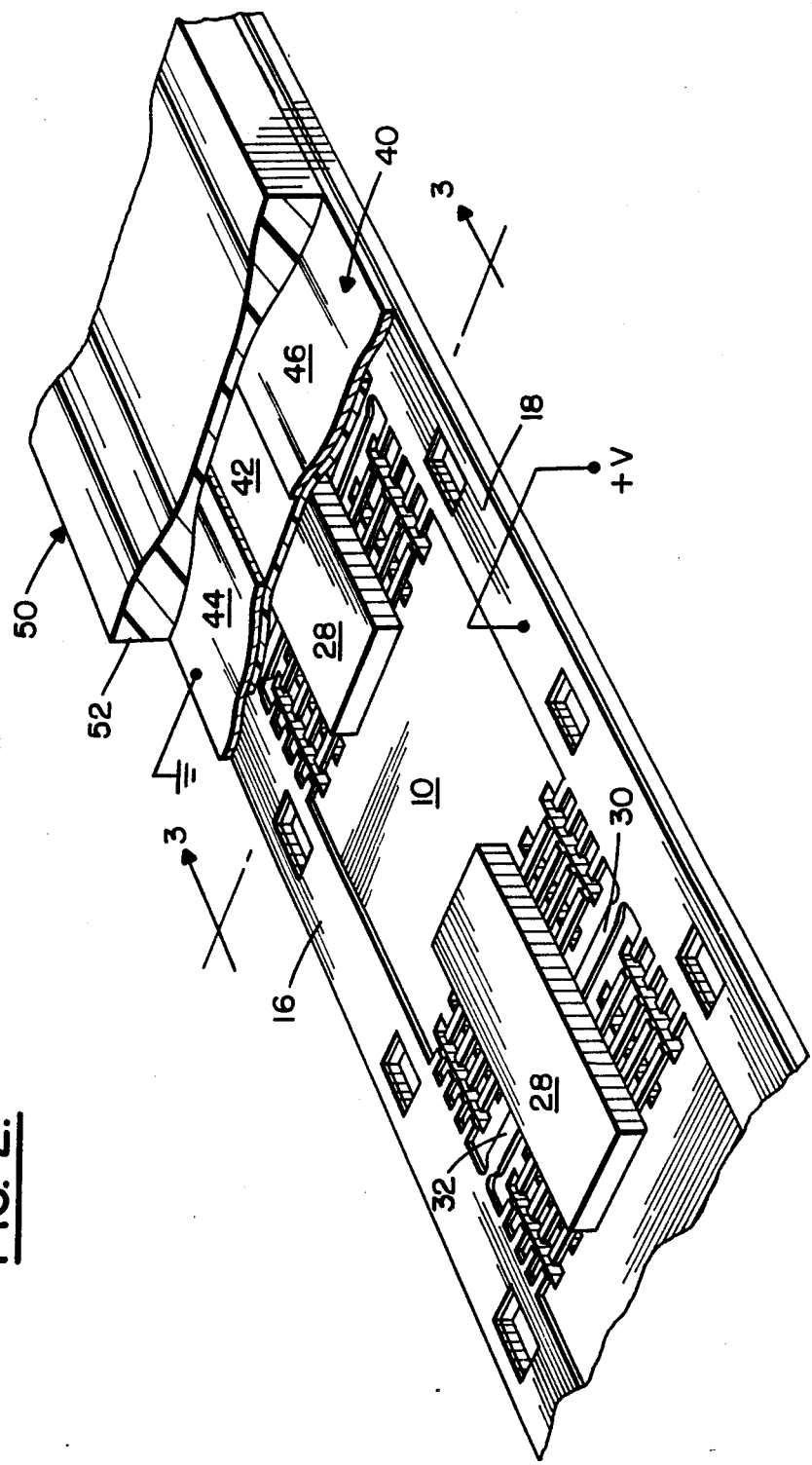
FIG. 2 is a perspective view of a modification of the the invention which enables more precise burn-in voltages to be applied to chip under test.

Referring now to FIG. 2, a modification of the invention is shown which enables the use of extended lengths of TAB tape (with connected chips) during burn-in. Because the thickness of ground and power buses 16 and 18 may be quite thin, voltage losses therein may be quite significant over an extended length of tape. To alleviate this voltage drop, an interposer tape 40 is provided and is sandwiched over the entire length of tape 10. Interposer tape 40 comprises an insulating tape portion 42 to which is bonded a pair of conductive sheet portions 44 and 46. Conductive sheet portions 44 and 46 provide a parallel conductive path along ground bus 16 and power bus 18 thereby enabling the voltage drops along TAB tape 10 to be minimized.

In order to assure good electrical contact between conductive sheet portions 44 and 46 with ground bus 16 and power bus 18 respectively, a spacer tape 50 is emplaced over tape 10. Spacer tape 50 is insulating, and includes resilient, thickened edge portions 52 and 54. The thickened edge portions wedge conductive sheets 44 and 46 against buses: 16 and 18 when the sandwich of tapes is wound on a mandrel. It also provides an insulating function between successive layers of tape windings.

Spacer tapes are commercially available and the 3M Company provides a 35 mm spacer tape with the product number 8735-0100. Other non-conductive elastomeric tapes with thickened edge portion are also equally acceptable.

Figure 3:
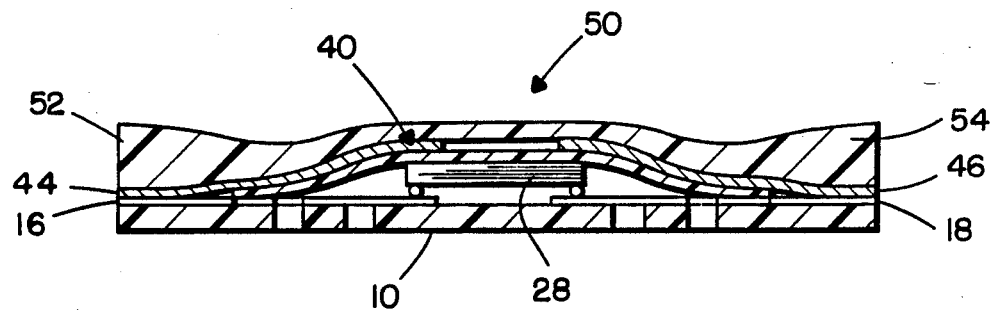
FIG. 3 is a sectional view of FIG. 2 taken along line 3-3.

In FIG. 3, a section of the structure shown in FIG. 2 is illustrated and portrays the relationship of interposer tape 40 with TAB tape 10 and spacer tape 50. It is to be noted that insulator tape portion 42 of interposer tape 40 prevents the shorting of conductive sheet portions 44 and 46 to the underlying signal conductors.

Figure 4:
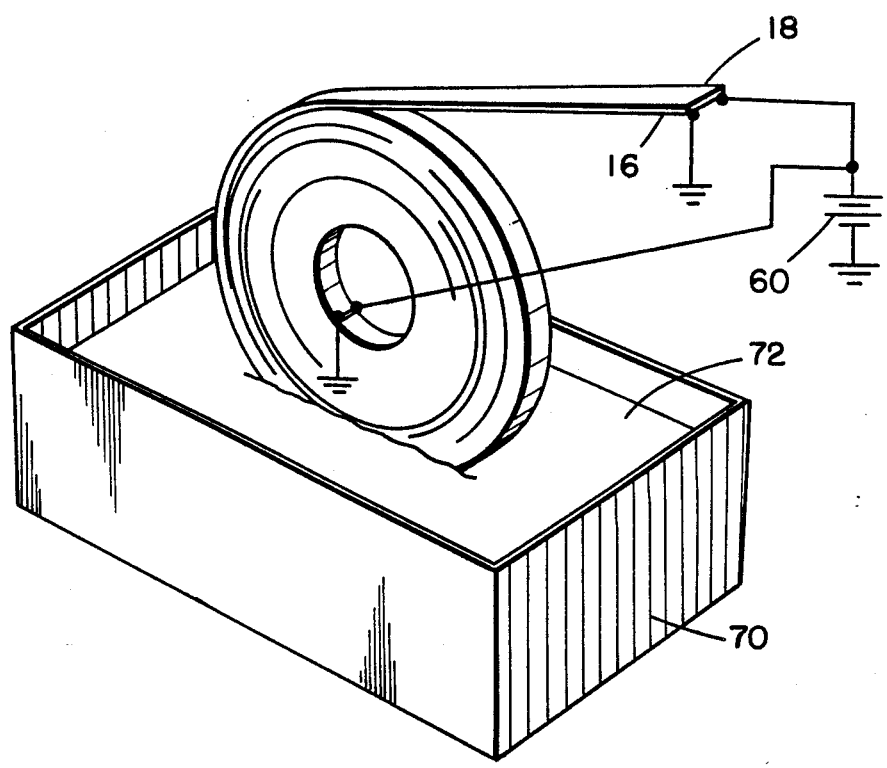

Turning now, to FIG. 4, TAB tape 10, interposer tape 40 and spacer tape 50 have been wound on a tape reel and are prepared for a static burn-in test. A power supply 60 is connected to power bus 18 and ground bus 16 is connected to a source of common potential. Additionally, power supply 60 is also connected to the other end of power bus 18. Similarly, the other end of ground bus 16 is connected to a source of common potential. It should be understood that the power and ground connections can be made to the conductive sheet portions of the interposer tape rather than the ground and power buses. Furthermore, additional intermediate connections can be made along the length of the tapes to avoid overly large voltage drops.

The entire reel is then immersed in a burn-in bath 70 which includes a quantity of heated liquid 72. Liquid 72 is an inert, non-reactive liquid, such as a commercially available perfluorocarbon. One such perfluorocarbon is "Fluorinert" from the Dupont Corporation, Wilmington, DE. These liquids have essentially no interaction with a wide range of packages including TAB packages, and are available having many distinct boiling points appropriate to a desired burn-in temperature.

Using this invention, should a chip under test fail catastrophically, there could result a low resistance short between the power and ground buses. This will alter the proper application of voltage to the other chips, given the larger than normal current being passed through the defective chip. Referring back to FIG. 1, a reduced section 100 is preferably inserted between each bus and one or more of the power or ground leads to a chip. In the event of chip failure or a significant drop in its internal resistivity, the current passing through section 100 causes the segment to melt (i.e. like a fuse), thereby removing the defective chip from the parallel current path.

Figure 5:
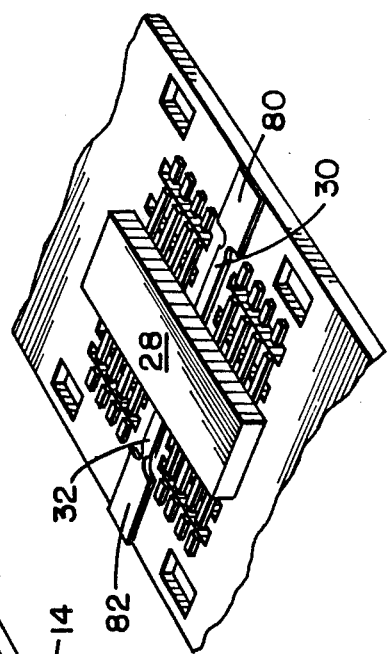
FIG. 5 is a perspective view of a modification to the invention as shown in FIG. 2.

A modification is shown in FIG. 5 to the tape/chip structure which avoids the need for continuous power and ground buses on tape 10. In lieu thereof, individual conductive land areas 80 and 82 are connected to each chip's power and ground connections 30 and 32, respectively. In this case, interposer tape 40 provides the power and ground interconnections with all of the individual land areas when the tape and interposer are wound on a mandrel.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

We claim:

1. A structure comprising:
   a carrier tape having an elongated dimension and a plurality of sets of beam leads thereon;
   at least one electronic device supported on said tape and electrically connected to at least one set of said beam leads, at least a first said beam lead connected to a common potential connection on said device and at least a second said beam lead connected to a power terminal on said device;
   a common potential bus which runs along said elongated dimension of said tape and is connected to said first beam lead;
   a power bus which runs along said elongated dimension and is connected to said second beam lead; and
   an interposer tape disposed in contact with said carrier tape, said interposer tape having a common potential portion and power portion, said interposer tape aligned with said carrier tape so that its common potential portion and power portion are aligned and in contact respectively with the common potential bus and power bus on said carrier tape, whereby said interposer tape portions provide parallel conductive pathways for said buses.

2. The structure as defined in claim 1 further comprising:
   power supply means connected between said common potential and power portions of said interposer tape.

3. The structure as defined in claim 1, further comprising:
   a spacer tape disposed over said interposer tape for urging said interposer tape against said carrier tape.

4. The structure, as defined in claim 2, wherein said spacer tape is provided with thickened edges which bear upon the common potential and power portions of said interposer tape when said spacer tape and interposer tape are brought into aligned contact.

5. The structure, as defined in claim 3, wherein a sandwich of said spacer tape, interposer tape, and carrier tape are wound about a mandrel and further comprising;
   heated fluid means for receiving said wound tapes and for elevating the temperature thereof.

6. The structure as defined in claim 1, wherein connections between said electronic devices and said buses contain reduced cross section portions which melt under overcurrent conditions.

7. A structure comprising:
   a carrier tape having an elongated dimension and a plurality of sets of beam leads thereon;
   a plurality of electronic devices supported on said tape, each electrically connected to a set of said beam leads, at least a first said beam lead connected to a common potential connection on said device and at least a second said beam lead connected to a power terminal on said device, said first and second beam leads terminating in isolated land areas respectively disposed along opposite sides of said tape;
   an interposer tape disposed in contact with said carrier tape, said interposer tape having a common potential portion and power portion, said interposer tape aligned with said carrier tape so that its common potential portion and power portion are aligned and in contact respectively with said common potential and power land areas on said carrier tape, whereby said interposer tape portions provide conductive pathways between said land areas; and
   a power supply connected between said common potential and power portions of said interposer tape.

8. The structure as defined in claim 7, further comprising:
   a spacer tape disposed over said interposer tape for urging said interposer tape against said carrier tape.

9. The structure, as defined in claim 8, wherein said spacer tape is provided with thickened edges which bear upon the common potential and power portions of said interposer tape when said spacer tape and interposer tape are brought into aligned contact.

* * * * *